United States Patent
Yang et al.

(10) Patent No.: US 10,909,929 B2
(45) Date of Patent: Feb. 2, 2021

(54) SCAN DRIVER

(71) Applicant: Samsung Display Co., Ltd., Yongin-si (KR)

(72) Inventors: Tae Hoon Yang, Yongin-si (KR); Ki Bum Kim, Yongin-si (KR); Jong Chan Lee, Yongin-si (KR); Woong Hee Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 145 days.

(21) Appl. No.: 16/210,379

(22) Filed: Dec. 5, 2018

(65) Prior Publication Data
US 2019/0295472 A1 Sep. 26, 2019

(30) Foreign Application Priority Data
Mar. 26, 2018 (KR) ........................ 10-2018-0034480

(51) Int. Cl.
- *G11C 19/00* (2006.01)
- *G09G 3/3266* (2016.01)
- *G09G 3/3291* (2016.01)
- *G09G 3/3233* (2016.01)
- *G09G 3/3258* (2016.01)

(Continued)

(52) U.S. Cl.
CPC ......... *G09G 3/3266* (2013.01); *G09G 3/3233* (2013.01); *G09G 3/3258* (2013.01); *G09G 3/3291* (2013.01); *H01L 27/3262* (2013.01); *H01L 27/3265* (2013.01); *H01L 27/3276* (2013.01); *G09G 3/3677* (2013.01); *G09G 2300/0426* (2013.01); *G09G 2300/0439* (2013.01); *G09G 2300/0809* (2013.01);
(Continued)

(58) Field of Classification Search
None
See application file for complete search history.

(56) References Cited

U.S. PATENT DOCUMENTS 9,786,240 B2 * 10/2017 Zhao .................... G09G 3/3677
2005/0184784 A1 * 8/2005 Washio ............ H03K 3/356113
327/215

(Continued)

FOREIGN PATENT DOCUMENTS

KR 10-2017-0060953 6/2017
KR 10-2017-0080885 7/2017

(Continued)

*Primary Examiner* — Tuan T Lam
(74) *Attorney, Agent, or Firm* — H.C. Park & Associates, PLC

(57) ABSTRACT

A scan driver includes stage circuits, each including: a first circuit including a control terminal (CT) connected to a first node (N1), and connecting/disconnecting a previous scan line of a previous stage circuit to a second node (N2) based on a control signal (CS); a second circuit including a CT connected to a clock signal line, and connecting one of a first power voltage line (FPVL) and a second power voltage line (SPVL) to the N1 based on a CS; a third circuit including a CT connected to the N2, and connecting one of the N1 and the SPVL to a third node (N3) based on a CS; a fourth circuit including a CT connected to the N3, and connecting one of the FPVL and the SPVL to a current scan line based on a CS; and a first capacitor connecting the CT of the third circuit and the SPVL.

24 Claims, 19 Drawing Sheets

(51) Int. Cl.
    *H01L 27/32*     (2006.01)
    *G09G 3/36*     (2006.01)
    *G11C 19/28*     (2006.01)

(52) U.S. Cl.
    CPC . *G09G 2310/0286* (2013.01); *G09G 2310/08* (2013.01); *G11C 19/28* (2013.01)

(56) References Cited

U.S. PATENT DOCUMENTS

| | | | |
|---|---|---|---|
| 2005/0259778 A1* | 11/2005 | Kimura | G11C 19/00 377/78 |
| 2013/0257703 A1* | 10/2013 | Huang | G11C 19/00 345/100 |
| 2014/0055334 A1* | 2/2014 | Qing | G11C 19/287 345/100 |
| 2014/0138181 A1* | 5/2014 | Mori | G10K 11/002 181/292 |
| 2014/0313174 A1* | 10/2014 | Murakami | G09G 3/3674 345/204 |
| 2015/0228354 A1* | 8/2015 | Qing | G09G 3/3674 345/100 |
| 2015/0243237 A1* | 8/2015 | Li | G11C 19/184 345/100 |
| 2016/0133336 A1* | 5/2016 | Lim | G11C 7/1066 365/230.03 |
| 2016/0163400 A1* | 6/2016 | Yu | G09G 3/3677 345/212 |
| 2017/0047128 A1* | 2/2017 | Dai | G09G 3/20 |
| 2017/0148392 A1 | 5/2017 | Kim | |
| 2017/0169757 A1* | 6/2017 | Kim | G09G 3/20 |
| 2017/0178559 A1* | 6/2017 | Kim | G11C 19/28 |
| 2017/0178560 A1* | 6/2017 | Lee | G09G 3/3266 |
| 2017/0365220 A1* | 12/2017 | Huang | G11C 19/28 |
| 2019/0180688 A1 | 6/2019 | Yang et al. | |

FOREIGN PATENT DOCUMENTS

| | | |
|---|---|---|
| KR | 10-2017-0112036 | 10/2017 |
| KR | 10-2019-0067956 | 6/2019 |

* cited by examiner

SCAN DRIVER

CROSS-REFERENCE TO RELATED APPLICATION

This application claims priority from and the benefit of Korean Patent Application No. 10-2018-0034480, filed Mar. 26, 2018, which is hereby incorporated by reference for all purposes as if fully set forth herein.

BACKGROUND

Field

Exemplary embodiments generally relate to a scan driver.

Discussion

With the development of information technologies, the importance of a display device, which is a connection medium between a user and information, increases. Accordingly, display devices, such as a liquid crystal display device, an organic light emitting display device, a plasma display device, and the like, are increasingly used.

A display device writes data voltages to pixels, respectively, and causes each pixel to emit light. Each pixel emits light with a luminance corresponding to the written data voltage. A display image may be composed of a light-emitting combination of the pixels and may be governed, at least in part, via operation of a scan driver. The scan driver generates scan signals for determining which pixel the data voltage is to be written. The pixels are disposed in a display area, and the scan driver is typically disposed in a non-display area outside the display area. Since it is not preferable that a circuit structure of the scan driver be visually recognized by a user, the scan driver may be covered with a bezel. It is noted, however, that reducing an area for the scan driver can be essential in constituting a display device having a narrow bezel.

The above information disclosed in this section is only for understanding the background of the inventive concepts, and, therefore, may contain information that does not form prior art.

SUMMARY

Some exemplary embodiments provide a scan driver capable of improving driving characteristics and reducing an occupied area as compared with a conventional scan driver.

Additional aspects will be set forth in the detailed description which follows, and, in part, will be apparent from the disclosure, or may be learned by practice of the inventive concepts.

According to some exemplary embodiments, a scan driver includes stage circuits. Each of the stage circuits includes first to fourth circuits and a first capacitor. The first circuit includes a control terminal connected to a first node. The first circuit is configured to selectively connect and disconnect a previous scan line of a previous stage circuit to a second node in accordance with a control signal. The second circuit includes a control terminal connected to a clock signal line. The second circuit is configured to selectively connect one of a first power voltage line and a second power voltage line to the first node in accordance with a control signal. The third circuit includes a control terminal connected to the second node. The third circuit is configured to selectively connect one of the first node and the second power voltage line to a third node in accordance with a control signal. The fourth circuit includes a control terminal connected to the third node. The fourth circuit is configured to selectively connect one of the first power voltage line and the second power voltage line to a current scan line in accordance with a control signal. The first capacitor connecting the control terminal of the third circuit and the second power voltage line.

In some exemplary embodiments, the first circuit may further include: a first transistor including one electrode connected to the previous scan line, another electrode connected to the second node, and a gate electrode connected to the first node; and a second transistor including one electrode connected to the previous scan line, another electrode connected to the second node, and a gate electrode connected to the clock signal line.

In some exemplary embodiments, the second circuit may further include: a third transistor including one electrode connected to the first power voltage line, another electrode connected to the first node, and a gate electrode connected to the clock signal line; and a fourth transistor including one electrode connected to the second power voltage line, another electrode connected to the first node, and a gate electrode connected to the clock signal line.

In some exemplary embodiments, the third circuit may further include: a fifth transistor including one electrode connected to the first node, another electrode connected to the third node, and a gate electrode connected to the second node; and a sixth transistor including one electrode connected to the second power voltage line, another electrode connected to the third node, and a gate electrode connected to the second node.

In some exemplary embodiments, the fourth circuit may further include: a seventh transistor including one electrode connected to the first power voltage line, another electrode connected to the current scan line, and a gate electrode connected to the third node; and an eighth transistor including one electrode connected to the second power voltage line, another electrode connected the current scan line, and a gate electrode connected to the third node.

In some exemplary embodiments, each of the stage circuits may further include a fifth circuit including a control terminal connected to the current scan line. The fifth circuit may be configured to selectively connect one of the first power voltage line and the second power voltage line to a current inversion scan line in accordance with a control signal.

In some exemplary embodiments, the fifth circuit may further include: a ninth transistor including one electrode connected to the first power voltage line, another electrode connected to the current inversion scan line, and a gate electrode connected to the current scan line; and a tenth transistor including one electrode connected to the second power voltage line, another electrode connected to the current inversion scan line, and a gate electrode connected to the current scan line.

In some exemplary embodiments, the stage circuits may be arranged in a first direction; the clock signal line, the first power voltage line, and the second power voltage line may extend in the first direction and may be branched and connected to each of the stage circuits; and the first circuit may be disposed in a second direction from the first power voltage line, the second direction crossing the first direction.

In some exemplary embodiments, the second circuit may be disposed in the first direction from the first circuit.

In some exemplary embodiments, the first capacitor may be disposed in the second direction from the second circuit.

In some exemplary embodiments, the third circuit may be connected to the second circuit such that the third circuit and the second circuit surround the first capacitor in a plan view.

In some exemplary embodiments, the fourth circuit may be disposed in the second direction from the third circuit.

In some exemplary embodiments, the fifth circuit may be disposed in the second direction from the fourth circuit.

In some exemplary embodiments, the first transistor may be disposed in the second direction from the second transistor.

In some exemplary embodiments, the fourth transistor may be disposed in the first direction from the third transistor.

In some exemplary embodiments, the sixth transistor may be disposed in the first direction from the fifth transistor.

In some exemplary embodiments, the seventh transistor may be disposed in the second direction from the eighth transistor.

In some exemplary embodiments, the ninth transistor may be disposed in the second direction from the tenth transistor.

In some exemplary embodiments, each of the stage circuits, the clock signal line, the first power voltage line, and the second power voltage line may include at least a part of at least one of a semiconductor layer, a first gate electrode layer, a second gate electrode layer, and a source/drain electrode layer.

In some exemplary embodiments, each of the clock signal line, the first power voltage line, and the second power voltage line may include at least a part of the source/drain electrode layer.

In some exemplary embodiments, one electrode and another electrode of each of the first to tenth transistors may include at least a part of the source/drain electrode layer, a gate electrode of each of the first to tenth transistors may include at least a part of the first gate electrode layer; and a channel of each of the first to tenth transistors may include at least a part of the semiconductor layer.

In some exemplary embodiments, the first capacitor may include at least a part of the first gate electrode layer and at least a part of the second gate electrode layer.

In some exemplary embodiments, the second node may include at least a part of the second gate electrode layer.

In some exemplary embodiments, the second power voltage line may be connected to each of the stage circuits using the second gate electrode layer.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
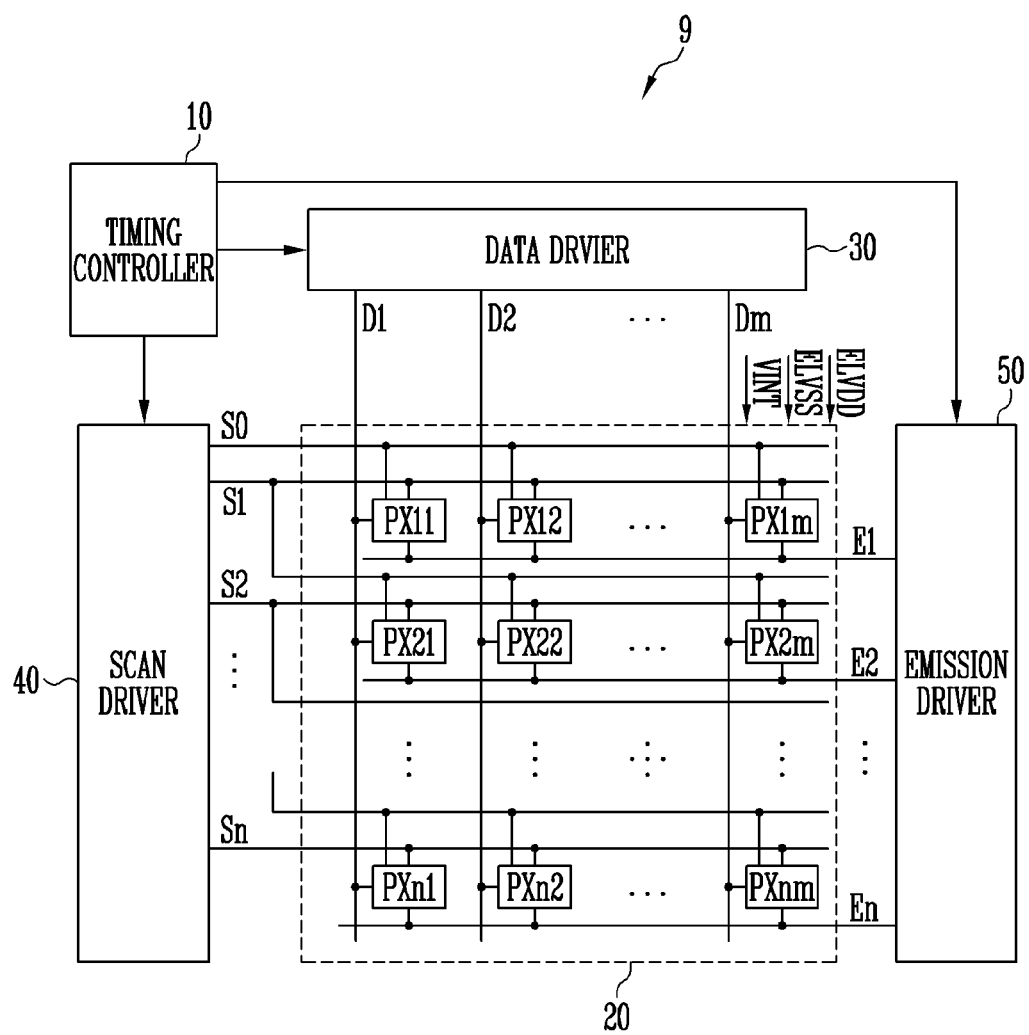
FIG. 1 is a diagram illustrating a display device according to some exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. Further, the D1-axis and the D2-axis are not limited to two axes of a rectangular coordinate system, and may be interpreted in a broader sense. For example, the D2-axis and the D2-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional, plan, and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. In this manner, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the inventive concepts. Further, the blocks, units, and/or modules of some exemplary embodiments may be physically combined into more complex blocks, units, and/or modules without departing from the inventive concepts.

FIG. 1 is a diagram illustrating a display device according to some exemplary embodiments.

Referring to FIG. 1, the display device 9 according to some exemplary embodiments includes a timing controller 10, a pixel unit 20, a data driver 30, a scan driver 40, and an emission driver 50.

The timing controller 10 converts control signals and image signals supplied from a processor (for example, an application processor) into control signals and image signals adapted to a specification of the display device 9, and supplies control signals and image signals to the data driver 30, the scan driver 40, and the emission driver 50.

The pixel unit 20 may include pixels PX11, PX12, ..., PX1m, PX21, PX22, ..., PX2m, ..., PXn1, PXn2, ..., and PXnm, where "n" and "m" are natural numbers greater than zero and may be different from one another. Each pixel may be connected to a corresponding data line and a corresponding scan line. Each pixel may receive a data voltage from the data line in response to (or in association with) a scan signal received from the scan line. Each pixel may emit light with a luminance corresponding to the data voltage responding to the emission signal received from an emission line. Each pixel may be connected to a first driving voltage line EVLDD, a second driving voltage line ELVSS, and an initialization voltage line VINT, and may receive voltages to display an image.

The data driver 30 receives the control signals and the image signals from the timing controller 10 and generates data voltages to be supplied to the data lines D1, D2, ..., and Dm. The data voltages generated in units of pixel rows may be simultaneously applied to the data lines D1, D2, ..., and Dm.

The scan driver 40 receives the control signals from the timing controller 10 and generates scan signals to be supplied to the scan lines S0, S1, S2, ..., and Sn. The scan driver 40 according to some exemplary embodiments will be described below in more detail with reference to FIG. 2 and subsequent figures.

The emission driver 50 may supply emission signals determining emission periods of the pixels PX11, PX12, ..., PX1m, PX21, PX22, ..., PX2m, ..., PXn1, PXn2, ..., and PXnm through emission lines E1, E2, ..., and En. For example, each pixel includes at least one emission transistor, and light emission control may be performed by determining whether or not a current flows to an organic light emitting diode in accordance with on/off states of the emission transistor. According to some exemplary embodiments, the emission driver 50 may be a sequential light emission type that allows each pixel row to emit light sequentially. According to some exemplary embodiments, the emission driver 50 may be a simultaneous light emission type that allows all pixel rows to emit light simultaneously.

Figure 2:
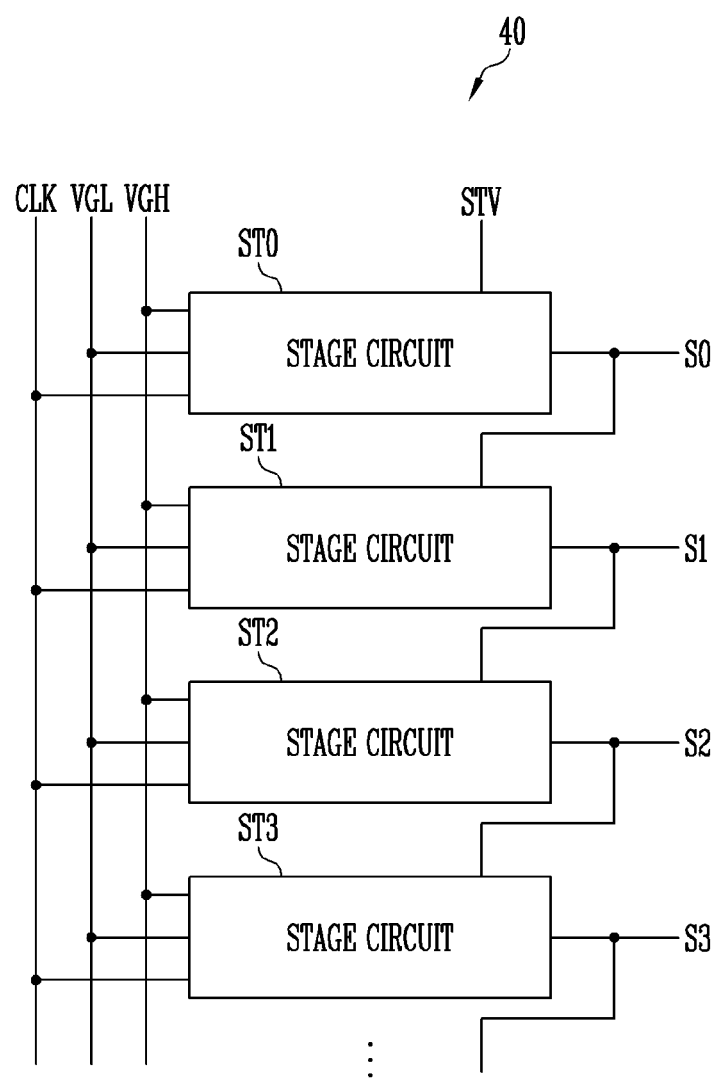
FIG. 2 is a diagram illustrating a scan driver of the display device of FIG. 1 according to some exemplary embodiments.

FIG. 2 is a diagram illustrating a scan driver of FIG. 1 according to some exemplary embodiments.

Referring to FIG. 2, the scan driver 40 according to some exemplary embodiments includes stage circuits ST0, ST1, ST2, ST3, ..., etc.

Each of the stage circuits ST0, ST1, ST2, ST3, ..., etc. is connected to a clock signal line CLK, a first power voltage line VGH, a second power voltage line VGL, a previous scan line, and a current scan line. However, the first stage circuit ST0 may be connected to a start scan line STV since no previous scan line exists.

A relatively high voltage is applied to the first power voltage line VGH and a relatively low voltage is applied to the second power voltage line VGL. The clock signal line CLK may be applied with a pulse type voltage alternating between a high voltage level and a low voltage level.

When a start pulse is provided through the start scan line STV connected to the first stage circuit ST0, the first stage circuit ST0 outputs a scan signal, which is generated by an internal operation, to the scan line S0. When the scan signal is provided through the previous scan line S0 connected to the next stage circuit ST1, the stage circuit ST1 outputs a scan signal, which is generated by an internal operation, to the scan line S1. This operation is repeatedly performed by the next stage circuits ST2, ST3, ..., and the like.

Figure 3:
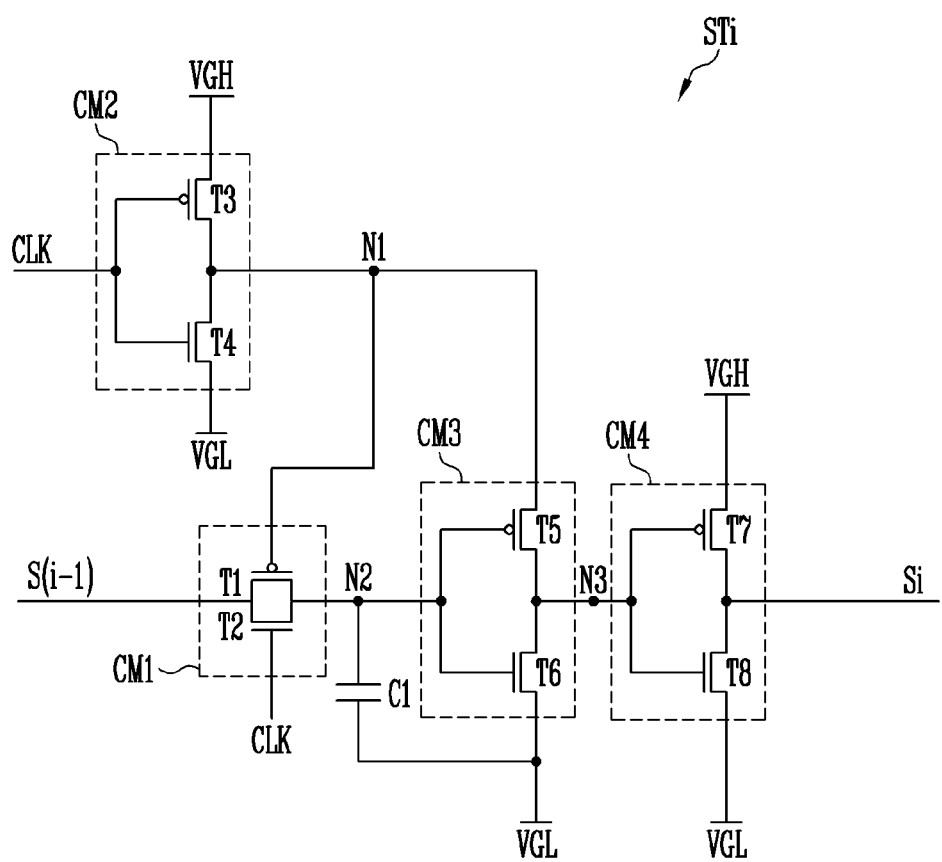
FIG. 3 is a diagram illustrating a stage circuit of the scan driver of FIG. 2 according to some exemplary embodiments.

FIG. 3 is a diagram illustrating a stage circuit of the scan driver of FIG. 2 according to some exemplary embodiments. Since the stage circuits ST0, ST1, ST2, ST3, ..., etc. may have substantially the same internal structure, the following description illustrates an exemplary i-th stage circuit STi.

Referring to FIG. 3, the stage circuit STi according to some exemplary embodiments includes a first circuit unit CM1, a second circuit unit CM2, a third circuit unit CM3, a fourth circuit unit CM4, and a first capacitor C1.

The first circuit unit CM1 includes a control terminal connected to a first node N1, and connects or disconnects a previous scan line S(i−1) of a previous stage circuit to a second node N2 in accordance with a control signal. Here, the control terminal of the first circuit unit CM1 may refer to a gate electrode of a first transistor T1.

The first circuit unit CM1 may further include the first transistor T1 and a second transistor T2. The first transistor T1 may include one electrode connected to the previous scan line S(i−1), another electrode connected to the second node N2, and a gate electrode connected to the first node N1. The second transistor T2 may further include one electrode connected to the previous scan line S(i−1), another electrode connected to the second node N2, and a gate electrode connected to the clock signal line CLK. The first transistor T1 may be a P-type transistor, and the second transistor T2 may be an N-type transistor.

The P-type transistor refers to a transistor in which the amount of conducted current increases when the voltage difference between the gate electrode and the source electrode increases in the negative direction. The N-type transistor refers to a transistor in which the amount of conducted current increases when the voltage difference between the gate electrode and the source electrode increases in the positive direction. The transistor may be configured in various forms such as a thin film transistor (TFT), a field effect transistor (FET), a bipolar junction transistor (BJT), or the like. In some exemplary embodiments, the circuit unit may refer to a complementary metal-oxide-semiconductor (CMOS) circuit unit including at least one P-type transistor and at least one N-type transistor. If a polarity of the scan signal is opposite the described exemplary embodiment, or for other needs, the types of the transistors included in each circuit unit might be substituted for each other. For example, the first transistor T1 of the first circuit unit CM1 may be configured as the N type transistor and the second transistor T2 may be configured as the P type transistor. At this time, a person skilled in the art may appropriately change the polarity of the first power voltage, the second power voltage, and/or the clock signal, if necessary. This description may also be applied to the following configurations, so a redundant description will be omitted.

The second circuit unit CM2 includes a control terminal connected to the clock signal line CLK, and connects one of a first power voltage line VGH and a second power voltage line VGL to the first node N1 in accordance with a control signal.

The second circuit unit CM2 may further include a third transistor T3 and a fourth transistor T4. The third transistor T3 may include one electrode connected to the first power voltage line VGH, another electrode connected to the first node N1, and a gate electrode connected to the clock signal line CLK. The fourth transistor T4 may include one electrode connected to the second power voltage line VGL, another electrode connected to the first node N1, and a gate electrode connected to the clock signal line CLK. The third transistor T3 may be a P-type transistor, and the fourth transistor T4 may be an N-type transistor.

The third circuit unit CM3 includes a control terminal connected to the second node N2, and connects one of the first node N1 and the second power voltage line VGL to a third node N3 in accordance with a control signal.

The third circuit unit CM3 may further include a fifth transistor T5 and a sixth transistor T6. The fifth transistor T5 may include one electrode connected to the first node N1, another electrode connected to the third node N3, and a gate electrode connected to the second node N2. The sixth transistor T6 may include one electrode connected to the second power voltage line VGL, another electrode connected to the third node N3, and a gate electrode connected to the second node N2. The fifth transistor T5 may be a P-type transistor, and the sixth transistor T6 may be an N-type transistor.

The fourth circuit unit CM4 includes a control terminal connected to the third node N3, and connects one of the first power voltage line VGH and the second power voltage line VGL to a current scan line Si in accordance with a control signal.

The fourth circuit unit CM4 may further include a seventh transistor T7 and an eighth transistor T8. The seventh transistor T7 may include one electrode connected to the first power voltage line VGH, another electrode connected to the current scan line Si, and a gate electrode connected to the third node N3. The eighth transistor T8 may include one electrode connected to the second power voltage line VGL, another electrode connected the current scan line Si, and a gate electrode connected to the third node N3. The seventh transistor T7 may be a P-type transistor, and the eighth transistor T8 may be an N-type transistor.

The first capacitor C1 connects the control terminal of the third circuit unit CM3 and the second power voltage line VGL. For instance, one electrode of the first capacitor C1 is connected to the second node N2, and another electrode of the first capacitor C1 is connected to the second power voltage line VGL.

FIGS. 4 to 8 are diagrams illustrating a driving method of the stage circuit of FIG. 3 according to some exemplary embodiments.

Figure 4:
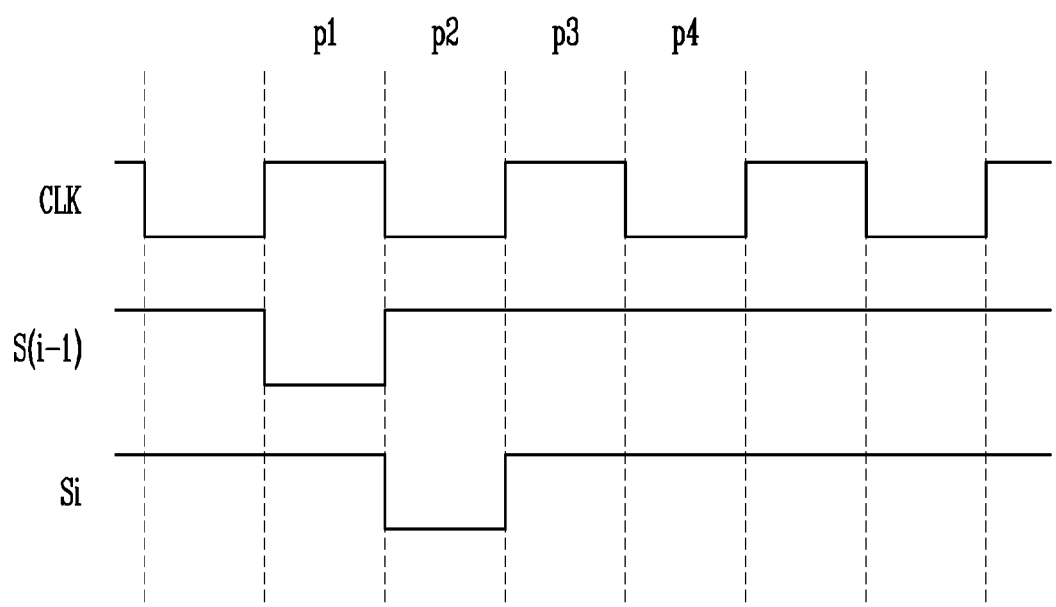
FIGS. 4 to 8 are diagrams illustrating a driving method of the stage circuit of FIG. 3 according to some exemplary embodiments.

The clock signal of the clock signal line CLK may be a pulse type voltage alternating between a low voltage level and a high voltage level. The period of the clock signal may be approximately two horizontal periods. In FIG. 4, one horizontal period corresponds to an interval between two nearest dashed lines. In the stage circuit STi, the clock signal acts as an input control signal.

The previous scan signal of the previous scan line S(i−1) is a voltage signal, which is maintained at the high level in most of the periods, but becomes the low level in a period p1. In the stage circuit STi, the previous scan signal acts as an input control signal.

The current scan signal of the current scan line Si is a voltage signal, which is maintained at the high level in most of the periods, but becomes the low level in a period p2. In the stage circuit STi, the current scan signal acts as an output signal.

Figure 5:
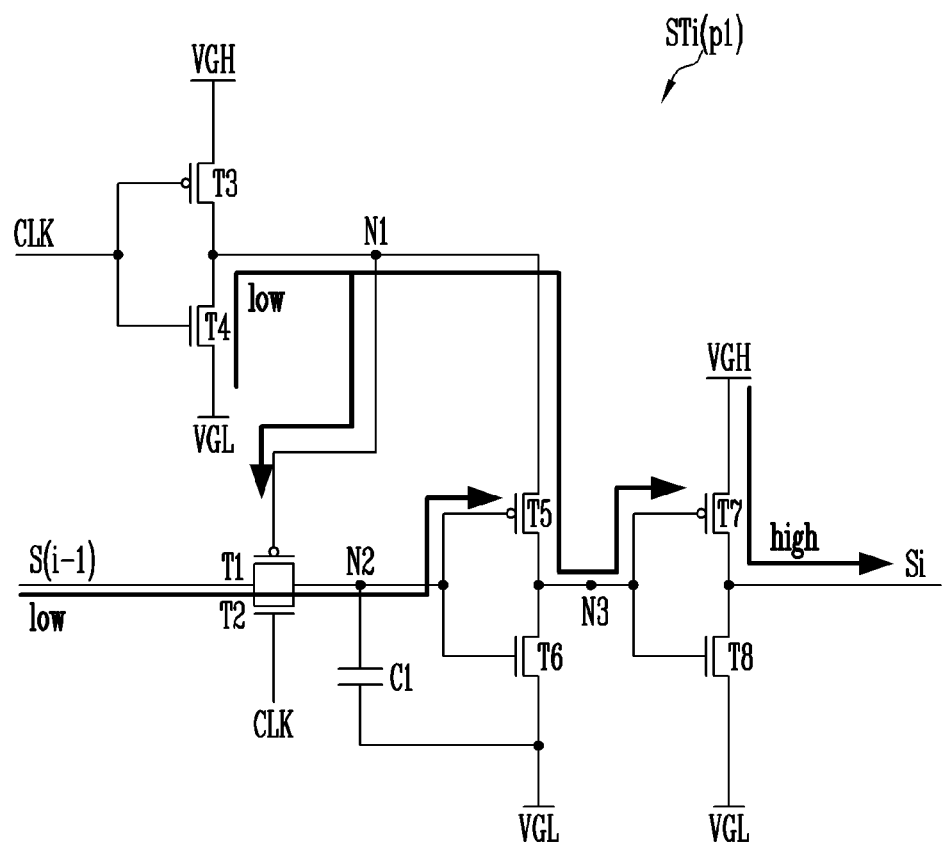

Referring to FIG. 5, the operation of the stage circuit STi in the period p1 will be described.

In the period p1, the input clock signal is at the high level and the previous scan signal is at the low level. Accordingly, the fourth transistor T4 is turned on, and the first node N1 and the second power voltage line VGL are connected. The first transistor T1 is turned on and the second node N2 is connected to the previous scan line S(i−1) as a low level voltage is applied to the first node N1. Since the previous scan signal is in a low level state, the transistor T5 is turned on, and the third node N3 and the second power voltage line VGL are connected through the fifth transistor T5 and the fourth transistor T4. The seventh transistor T7 is turned on as the low level voltage is applied to the third node N3, and the first power voltage line VGH is connected to the current scan line Si. Therefore, in the period p1, the stage circuit STi outputs a high level scan signal. At this time, the first capacitor C1 maintains the low level voltage applied to the second node N2.

Figure 6:
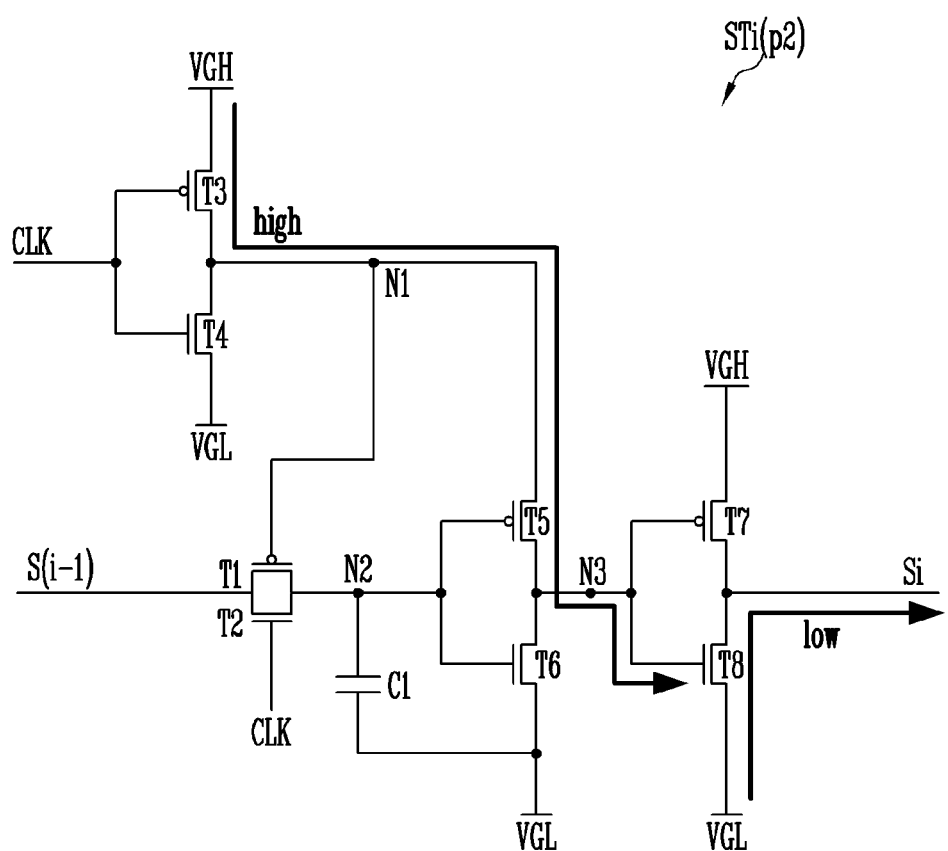

Referring to FIG. 6, the operation of the stage circuit STi in the period p2 will be described.

In the period p2, the input clock signal is at the low level, and the previous scan signal is at the high level. Accordingly, the third transistor T3 is turned on, and the first node N1 and the first power voltage line VGH are connected. The first transistor T1 is turned off as a high level voltage is applied to the first node N1. Since the second node N2 is maintained at the low level due to the first capacitor C1, the fifth transistor T5 is turned on, and the third node T3 and the first power voltage line VGH are connected through the fifth transistor T5 and the third transistor T3. As the high level voltage is applied to the third node N3, the eighth transistor T8 is turned on, and the second power voltage line VGL is connected to the current scan line Si. Therefore, in the period p2, the stage circuit STi outputs a low level scan signal.

Figure 7:
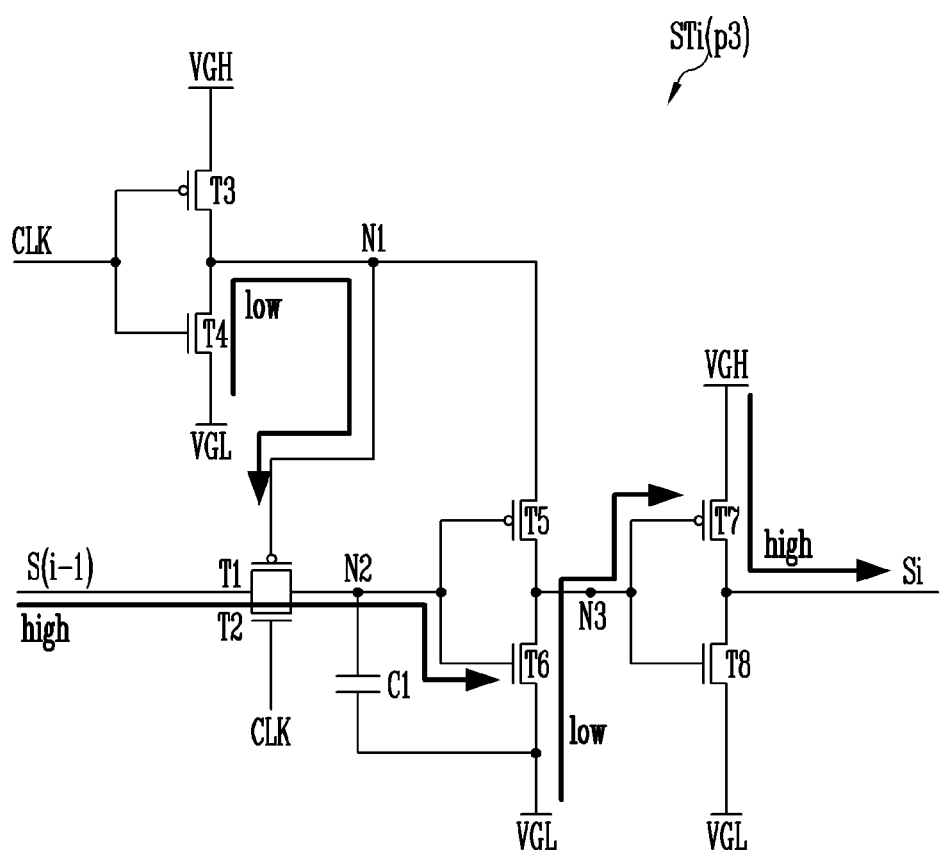

Referring to FIG. 7, the operation of the stage circuit STi in a period p3 will be described.

In the period p3, the input clock signal is at the high level and the previous scan signal is at the high level. Accordingly, the fourth transistor T4 is turned on, and the second power voltage line VGL and the first node N1 are connected. As a low level voltage is applied to the first node N1, the first transistor T1 is turned on, and the second node N2 is connected to the previous scan line S(i−1). Since the previous scan signal is in the high level state, the sixth transistor T6 is turned on, and the third node N3 and the second power voltage line VGL are connected through the sixth transistor T6. As the low level voltage is applied to the third node N3, the seventh transistor T7 is turned on, and the first power voltage line VGH is connected to the current scan line Si. Therefore, in the period p3, the stage circuit STi outputs a high level scan signal. At this time, the first capacitor C1 maintains a high level voltage applied to the second node N2.

Figure 8:
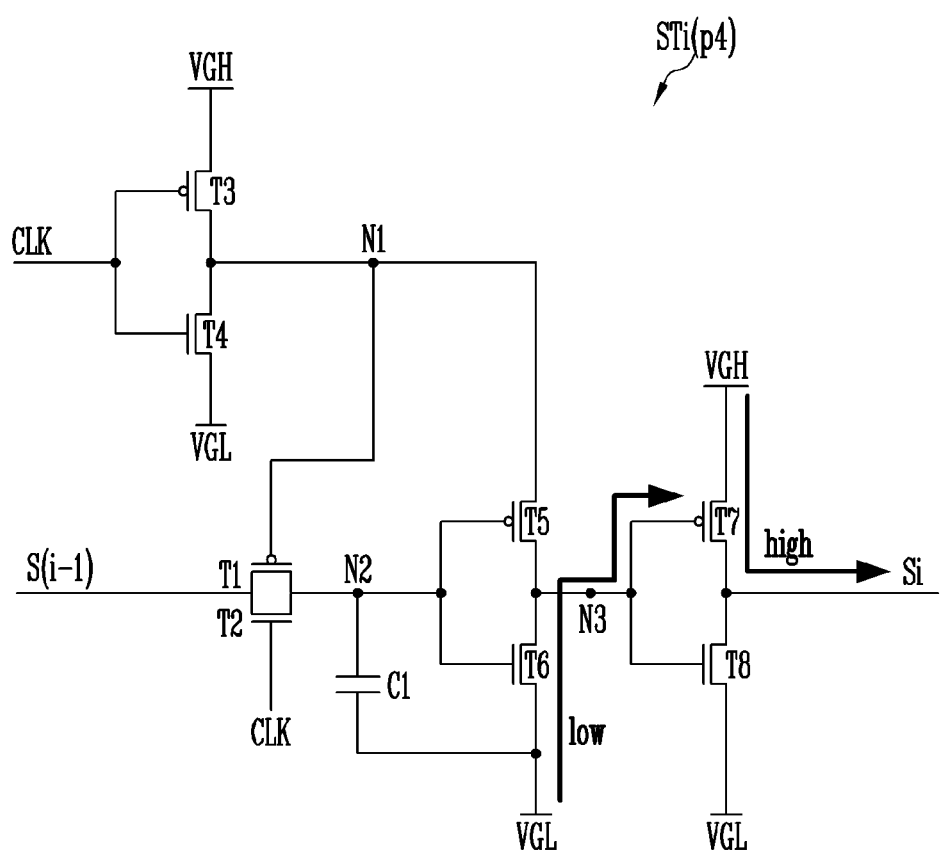

Referring to FIG. 8, the operation of the stage circuit STi in a period p4 will be described.

In the period p4, the input clock signal is at the low level and the previous scan signal is at the high level. Accordingly, the third transistor T3 is turned on, and the first node N1 and the first power voltage line VGH are connected. The first transistor T1 is turned off as a high level voltage is applied to the first node N1. The sixth transistor T6 is turned on since the second node N2 is maintained at a high level due to the first capacitor C1, and the third node N3 and the second power voltage line VGL are connected through the sixth transistor T6. The seventh transistor T7 is turned on as the low level voltage is applied to the third node N3, and the first power voltage line VGH is connected to the current scan line Si. Therefore, in the period p4, the stage circuit STi outputs a high level scan signal.

According to some exemplary embodiments, the clock signal is used only as a control signal, and is not used as a power voltage directly applied to the scan line Si. Therefore, a load on the clock signal is relatively small as compared with a scan driver of a conventional product so that the clock signal line CLK may be configured relatively thin. This helps the display device 9 have a narrow bezel independently from the layout of FIG. 17 to be described below.

In addition, according to various exemplary embodiments, it is possible to prevent (or at least reduced) degradation of a transistor due to a boosting process, and it is possible to reduce the area of the stage circuit STi as an area of the capacitor is reduced. In addition, since the number of elements disposed in the current path from the first and second power voltage lines VGH and VGL to the scan line Si is relatively small as compared with conventional products, driving characteristics are also increased and/or improved.

Figure 9:
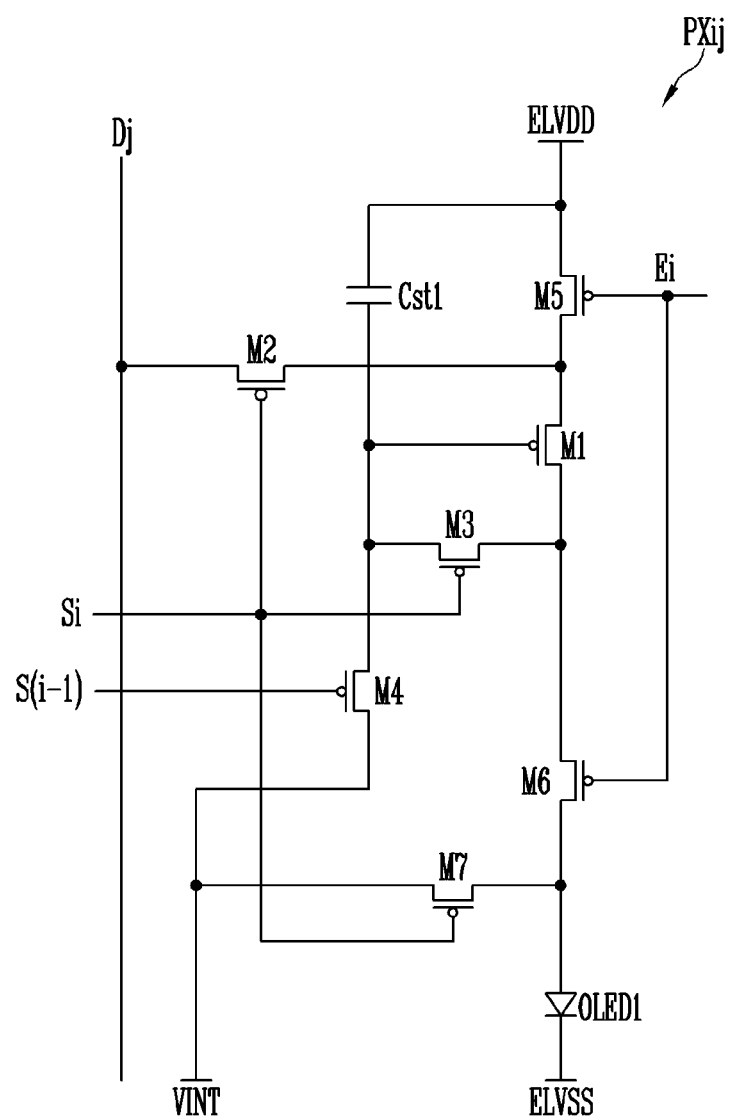
FIG. 9 is a diagram illustrating a pixel of the display device of FIG. 1 according to some exemplary embodiments.

FIG. 9 is a diagram illustrating a pixel of the display device of FIG. 1 according to some exemplary embodiments.

Referring to FIG. 9, a pixel PXij includes transistors M1, M2, M3, M4, M5, M6, and M7, a storage capacitor Cst1, and an organic light emitting diode OLED1.

One electrode of the storage capacitor Cst1 may be connected to the first driving voltage line ELVDD, and another electrode may be connected to the gate electrode of the transistor M1.

One electrode of the transistor M1 may be connected to another electrode of the transistor M5, another electrode of the transistor M1 may be connected to one electrode of the transistor M6, and a gate electrode of the transistor M1 may be connected to another electrode of the storage capacitor Cst1. The transistor M1 may be referred to as a driving transistor. The transistor M1 determines the amount of driving current flowing between the first driving voltage line ELVDD and the second driving voltage line ELVSS according to a potential difference between the gate electrode and a source electrode of the transistor M1.

One electrode of the transistor M2 may be connected to a data line Dj, another electrode of the transistor M2 may be connected to one electrode of the transistor M1, and a gate electrode of the transistor M2 may be connected to the current scan line Si. The transistor M2 may be referred to as a scan transistor. The transistor M2 draws a data voltage of the data line Dj to the pixel PXij when a scan signal of a turn-on level is applied to the current scan line Si.

One electrode of the transistor M3 is connected to another electrode of the transistor M1, another electrode of the transistor M3 is connected to the gate electrode of the transistor M1, and a gate electrode of the transistor M3 is connected to the current scan line Si. The transistor M3 connects the transistor M1 in a diode form when the scan signal of the turn-on level is applied to the current scan line Si.

One electrode of the transistor M4 is connected to the gate electrode of the transistor M1, another electrode of the transistor M4 is connected to an initialization voltage line VINT, and a gate electrode of the transistor M4 is connected to a previous scan line S(i−1). In some exemplary embodiments, the gate electrode of the transistor M4 may be connected to another scan line. The transistor M4 transfers the initialization voltage to the gate electrode of the transistor M1 when the scan signal of the turn-on level is applied to the previous scan line S(i−1), which initializes the charge amount of the gate electrode of the transistor M1.

One electrode of the transistor M5 is connected to the first driving voltage line ELVDD, another electrode of the transistor M5 is connected to one electrode of the transistor M1, and a gate electrode of the transistor M5 is connected to an emission line Ei. One electrode of the transistor M6 is connected to another electrode of the transistor M1, another electrode of the transistor M6 is connected to an anode of the organic light emitting diode OLED1, and a gate electrode of the transistor M6 is connected to the emission line Ei. The transistors M5 and M6 may be referred to as emission transistors. The transistors M5 and M6 form a driving current path between the first driving voltage line ELVDD and the second driving voltage line ELVSS to allow the organic light emitting diode OLED1 to emit light when the emission signal of the turn-on level is applied.

One electrode of the transistor M7 is connected to the anode of the organic light emitting diode OLED1, another electrode of the transistor M7 is connected to the initialization voltage line VINT, and a gate electrode of the transistor M7 is connected to the current scan line Si. In some exemplary embodiments, the gate electrode of the transistor M7 may be connected to another scan line. The transistor M7 transfers the initialization voltage to the anode of the organic light emitting diode OLED1 when the scan signal of the turn-on level is applied to the current scan line Si, which initializes the amount of charge accumulated in the organic light emitting diode OLED1.

The anode of the organic light emitting diode OLED1 is connected to another electrode of the transistor M6, and the cathode of the organic light emitting diode OLED1 is connected to the second driving voltage line ELVSS.

Figure 10:
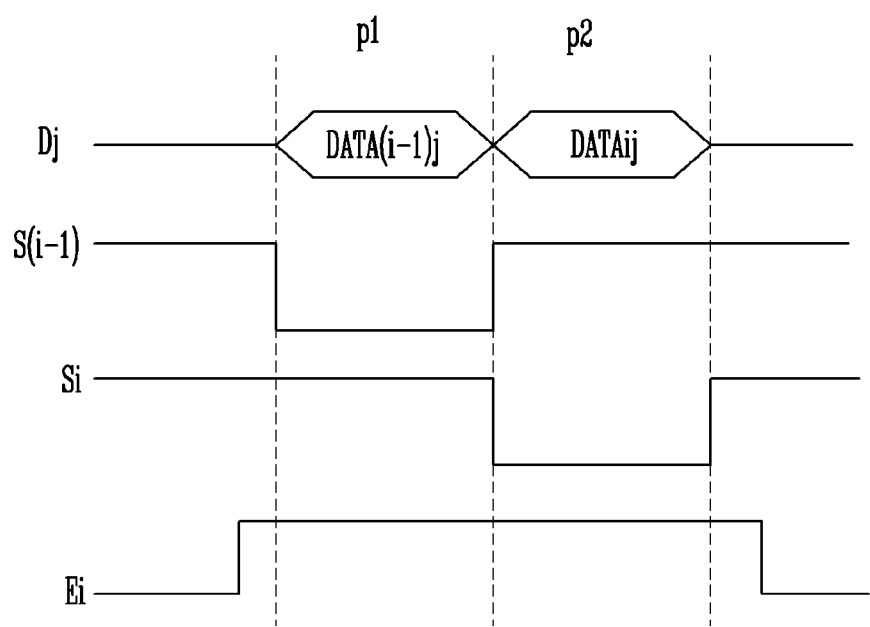
FIG. 10 is a diagram illustrating a driving method of the pixel of FIG. 9 according to some exemplary embodiments.

FIG. 10 is a diagram illustrating a driving method of the pixel of FIG. 9 according to some exemplary embodiments.

In the period p1, a data voltage DATA(i−1)j for a previous pixel row is applied to the data line Dj, and the scan signal of the turn-on level (e.g., low level) is applied to the previous scan line S(i−1). Since the scan signal of the turn-off level (e.g., high level) is applied to the current scan line Si, the transistor M2 is turned off, and the data voltage DATA(i−1)j for the previous pixel row is prevented from being drawn into the pixel PXij.

At this time, since the transistor M4 is turned on, the initialization voltage is applied to the gate electrode of the transistor M1 to initialize the charge amount. Since the emission signal of the turn-off level is applied to the emission line Ei, the transistors M5 and M6 are turned off. Therefore, unnecessary light emission of the organic light emitting diode OLED1 due to the process of applying the initialization voltage is prevented.

In the period p2, a data voltage DATAij for the current pixel row is applied to the data line Dj, and the scan signal of the turn-on level is applied to the current scan line Si. As a result, the transistors M1, M2, and M3 are turned on, and the data line Dj and the gate electrode of the transistor M1 are electrically connected. Therefore, the data voltage DATAij is applied to another electrode of the storage capacitor Cst1, and the storage capacitor Cst1 accumulates an amount of charge corresponding to the difference between the voltage of the first driving voltage line ELVDD and the data voltage DATAij.

Since the transistor M7 is turned on, the initialization voltage is applied to the anode of the organic light emitting diode OLED1, and the organic light emitting diode OLED1 is precharged or initialized with an amount of charge corresponding to the voltage difference between the initialization voltage and the second driving voltage line ELVSS.

The transistors M5 and M6 are turned on as the emission signal of the turn-on level is applied to the emission line Ei after the period p2. The amount of driving current passing through the transistor M1 is adjusted according to the amount of charge stored in the storage capacitor Cst1. The driving current flows through the organic light emitting diode OLED1. The organic light emitting diode OLED1 emits light until the emission signal of the turn-off level is applied to the emission line Ei.

Figure 11:
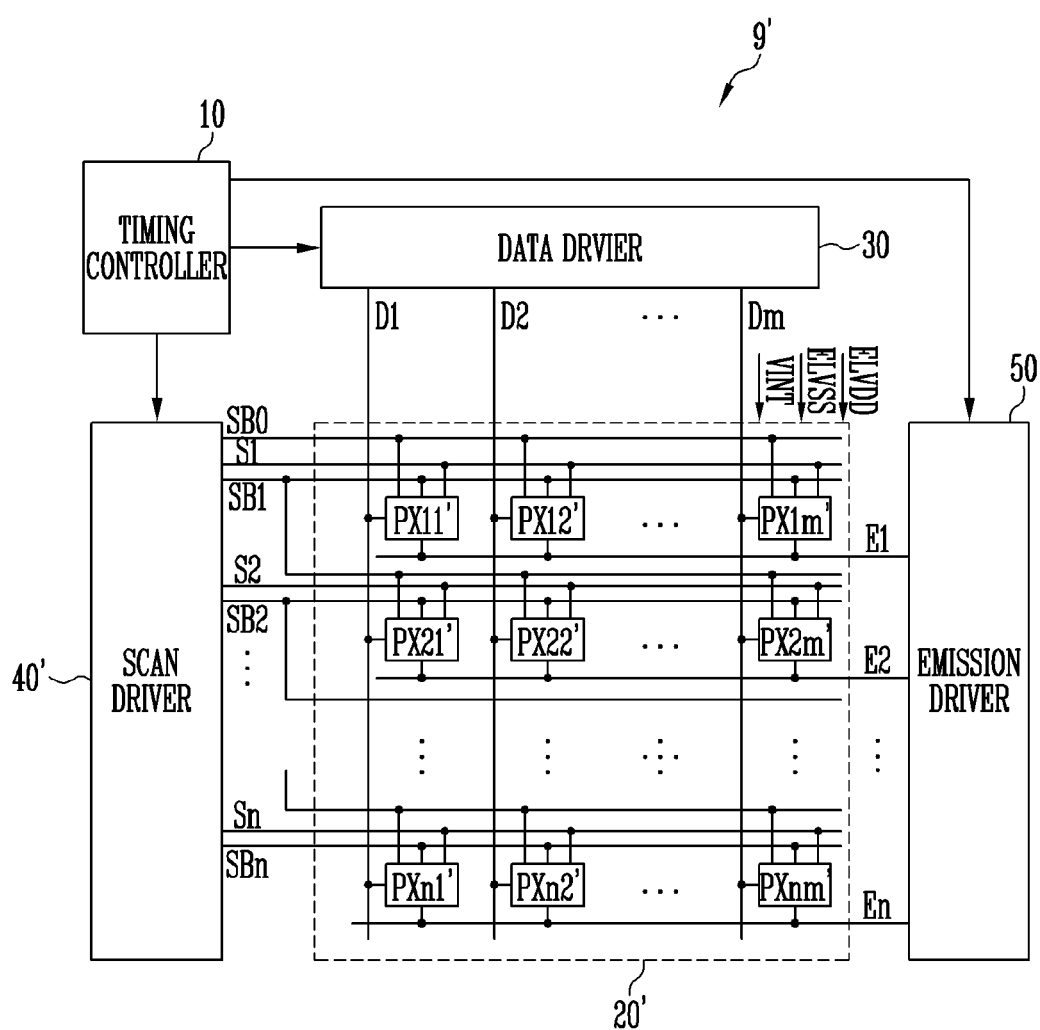
FIG. 11 is a diagram illustrating a display device according to some exemplary embodiments.

FIG. 11 is a diagram illustrating a display device according to some exemplary embodiments. The display device 9' of FIG. 11 is substantially the same as the display device 9 of FIG. 1, except for a configuration of the pixel unit 20' and the scan driver 40'. Therefore, redundant descriptions will be omitted.

Referring to FIG. 11, the display device 9' according to some exemplary embodiments includes the timing controller 10, a pixel unit 20', the data driver 30, a scan driver 40', and the emission driver 50.

The pixel unit 20' and the scan driver 40' are connected through the scan lines S1, S2, . . . , and Sn and inversion scan lines SB0, SB1, . . . , and SBn for each corresponding pixel row. A pixel structure of the changed pixel unit 20' and a stage circuit structure of the changed scan driver 40' will be described with reference to FIG. 12 and subsequent figures.

Figure 12:
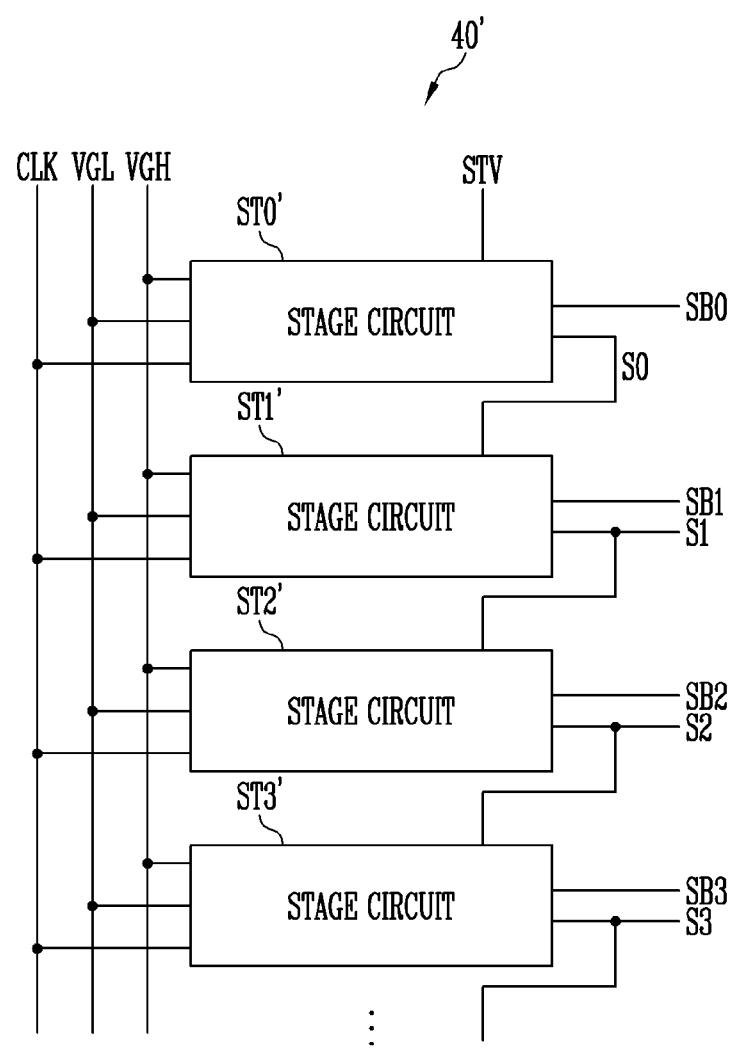
FIG. 12 is a diagram illustrating a scan driver of the display device of FIG. 11 according to some exemplary embodiments.

FIG. 12 is a diagram illustrating a scan driver of FIG. 11 according to some exemplary embodiments. The scan driver 40' of FIG. 12 is substantially the same as the scan driver 40 of FIG. 2, except for the inversion scan lines SB0, SB1, SB2, SB3, etc. Therefore, redundant descriptions will be omitted.

Referring to FIG. 12, the scan driver 40' includes stage circuits ST0', ST1', ST2', ST3', etc. Each stage of the stage circuits ST0', ST1', ST2', ST3', etc. includes an inversion scan line as an output line in addition to the scan line. The scan line S0 of the first stage circuit ST0' may not extend to the pixel unit 20' and may be used only as an input control line of the next stage circuit ST1'. Depending on the signals to the pixels, utilization of each output line may be otherwise configured.

Figure 13:
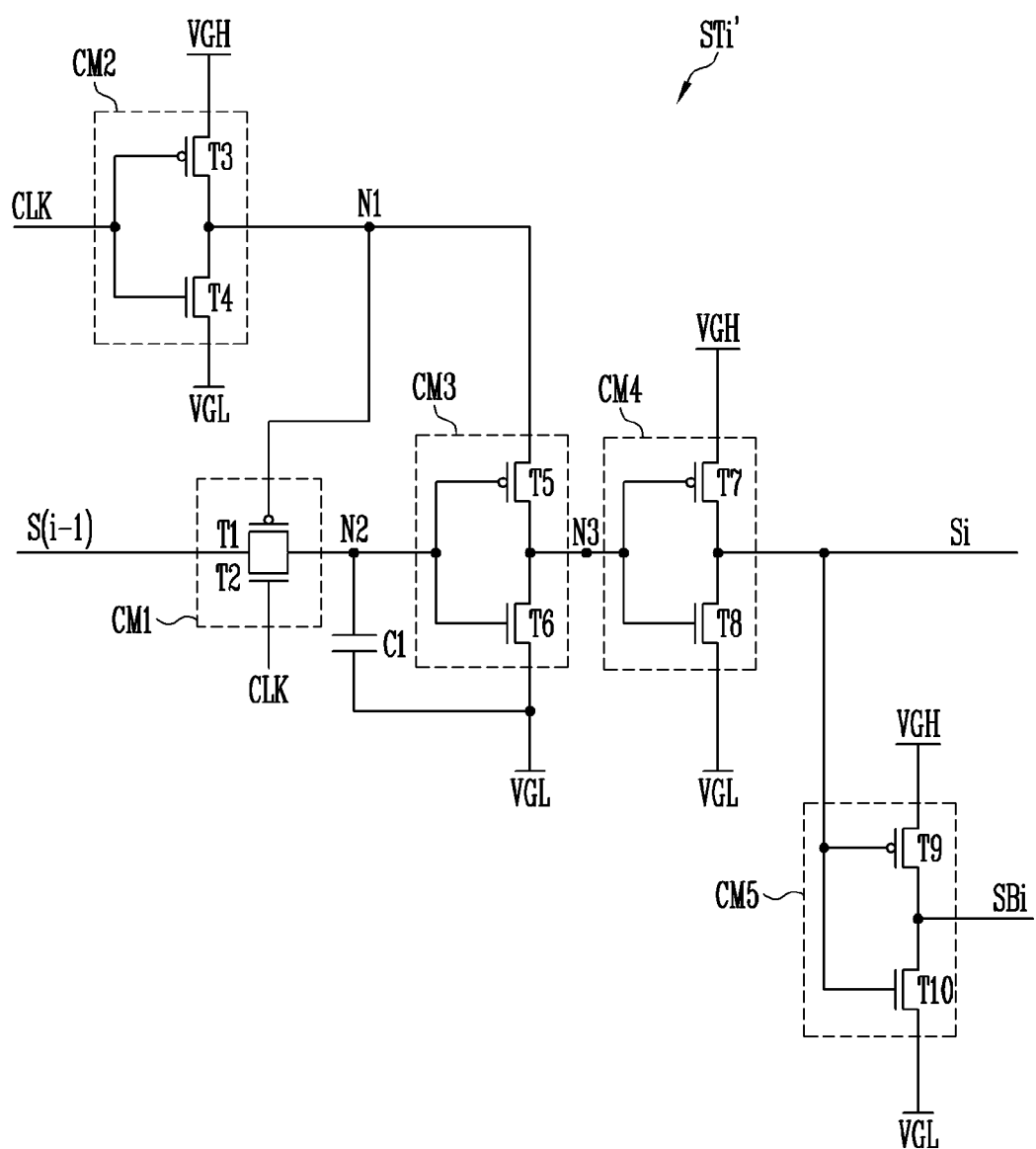
FIG. 13 is a diagram illustrating a stage circuit of the scan driver of FIG. 12 according to some exemplary embodiments.

FIG. 13 is a diagram illustrating a stage circuit of FIG. 12 according to some exemplary embodiments. The stage circuit STi' of FIG. 13 is substantially the same as the stage circuit STi of FIG. 3, except for the fifth circuit unit CM5, and thus, redundant descriptions will be omitted.

Referring to FIG. 13, a stage circuit STi' includes the first circuit unit CM1, the second circuit unit CM2, the third circuit unit CM3, the fourth circuit unit CM4, a fifth circuit unit CM5, and the first capacitor C1.

The fifth circuit unit CM5 includes a control terminal connected to the current scan line Si, and connects one of the first power voltage line VGH and the second power voltage line VGL to a current inversion scan line SBi in accordance with a control signal.

The fifth circuit unit CM5 may further include a ninth transistor T9 and a tenth transistor T10. The ninth transistor T9 may include one electrode connected to the first power voltage line VGH, another electrode connected to the current inversion scan line SBi, and a gate electrode connected to the current scan line Si. The tenth transistor T10 may include one electrode connected to the second power voltage line VGL, another electrode connected to the current inversion scan line SBi, and a gate electrode connected to the current scan line Si. The ninth transistor T9 may be a P-type transistor, and the tenth transistor T10 may be an N-type transistor.

Figure 14:
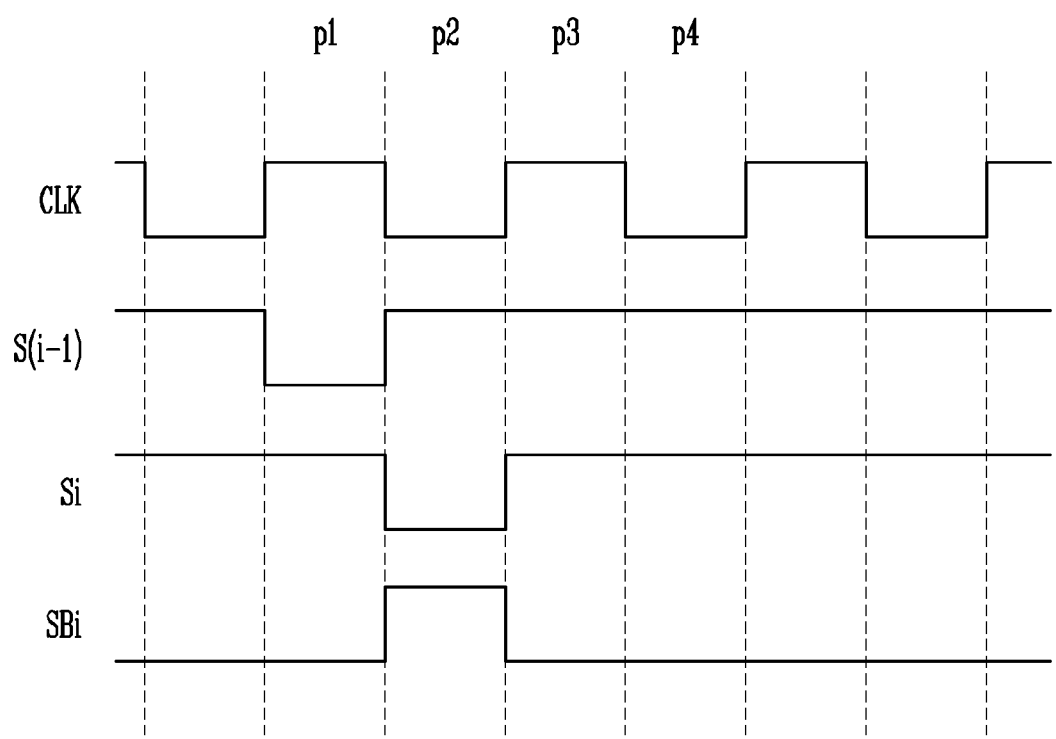
FIG. 14 is a diagram illustrating a driving method of the stage circuit of FIG. 13 according to some exemplary embodiments.

FIG. 14 is a diagram illustrating a driving method of the stage circuit of FIG. 13 according to some exemplary embodiments. In the driving method of the stage circuit STi' according to some exemplary embodiments, generation of the scan signal of the current scan line Si is substantially the same as that of the driving method of the stage circuit STi of FIG. 3. As such, redundant descriptions will be omitted.

According to the driving method of the stage circuit STi', an inversion scan signal may be generated through the current inversion scan line SBi.

During the periods p1, p3, and p4 when the current scan line Si is connected to the first power voltage line VGH, the tenth transistor T10 is turned on. Therefore, the current inversion scan line SBi is connected to the second power voltage line VGL during the periods p1, p3, and p4, and outputs the current inversion scan signal of the low level.

Further, during the period p2 when the current scan line Si is connected to the second power voltage line VGL, the ninth transistor T9 is turned on. Therefore, the current inversion scan line SBi is connected to the first power voltage line VGH during the period p2, and outputs the current inversion scan signal of the high level.

Figure 15:
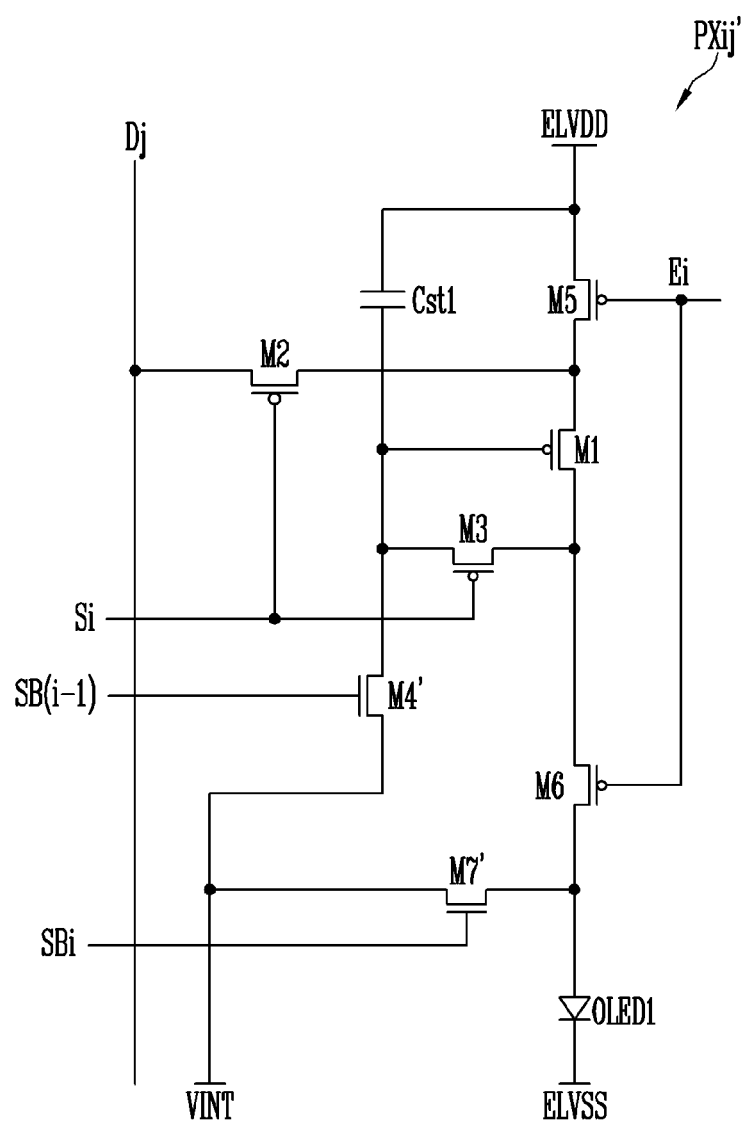
FIG. 15 is a diagram illustrating a pixel of the display device of FIG. 11 according to some exemplary embodiments.
Figure 16:
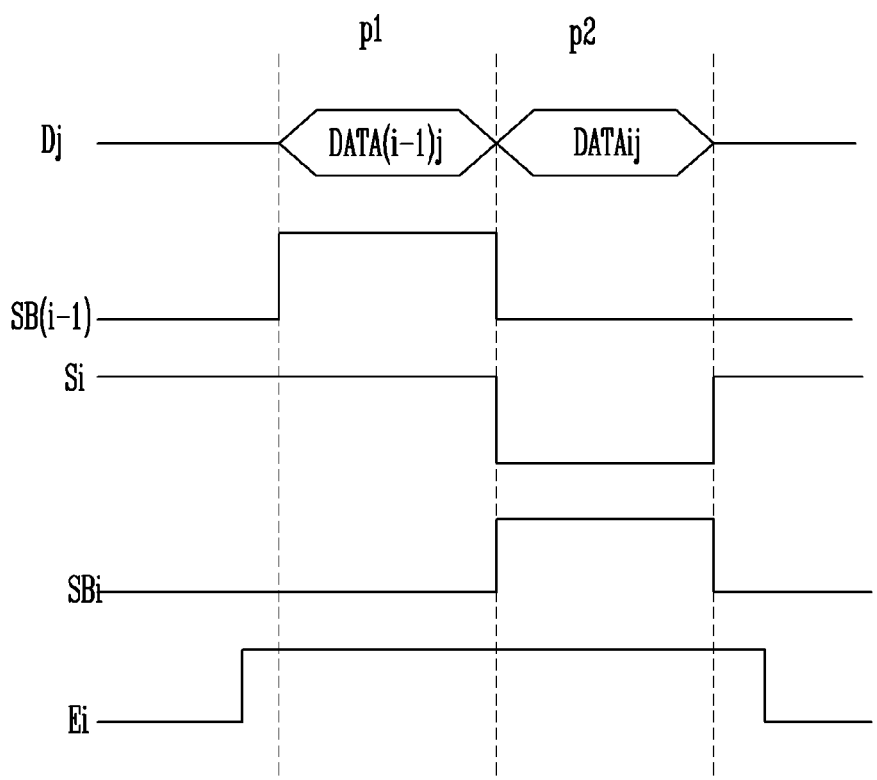
FIG. 16 is a diagram illustrating a driving method of the pixel of FIG. 15 according to some exemplary embodiments.

FIG. 15 is a diagram illustrating a pixel of FIG. 11 according to some exemplary embodiments. FIG. 16 is a diagram illustrating a driving method of the pixel of FIG. 15 according to some exemplary embodiments. The pixel PXij' of FIG. 15 has substantially the same configuration as the pixel PXij of FIG. 9, except for the transistors M4' and M7'. Therefore, redundant descriptions will be omitted.

Referring to FIG. 15, a pixel PXij' includes transistors M1, M2, M3, M4', M5, M6, and M7', the storage capacitor Cst1, and the organic light emitting diode OLED1.

The transistor M4' may be an N-type transistor. A gate electrode of the transistor M4' may be connected to the previous inversion scan line SB(i−1).

The transistor M7' may be an N-type transistor. A gate electrode of the transistor M7' may be connected to the current inversion scan line SBi.

Referring to FIG. 16, turn-on timings and turn-off timings of the transistors M1, M2, M3, M4', M5, M6, and M7' of the pixel PXij' are substantially the same as those of the transistors M1, M2, M3, M4, M5, M6, and M7 of the pixel PXij. Therefore, redundant descriptions will be omitted. It is noted, however, that since transistors M4' and M7' are N-type transistors versus P-type transistors, the voltage levels to the transistors M4' and M7' are opposite to those as shown and described in association FIG. 10.

Figure 17:
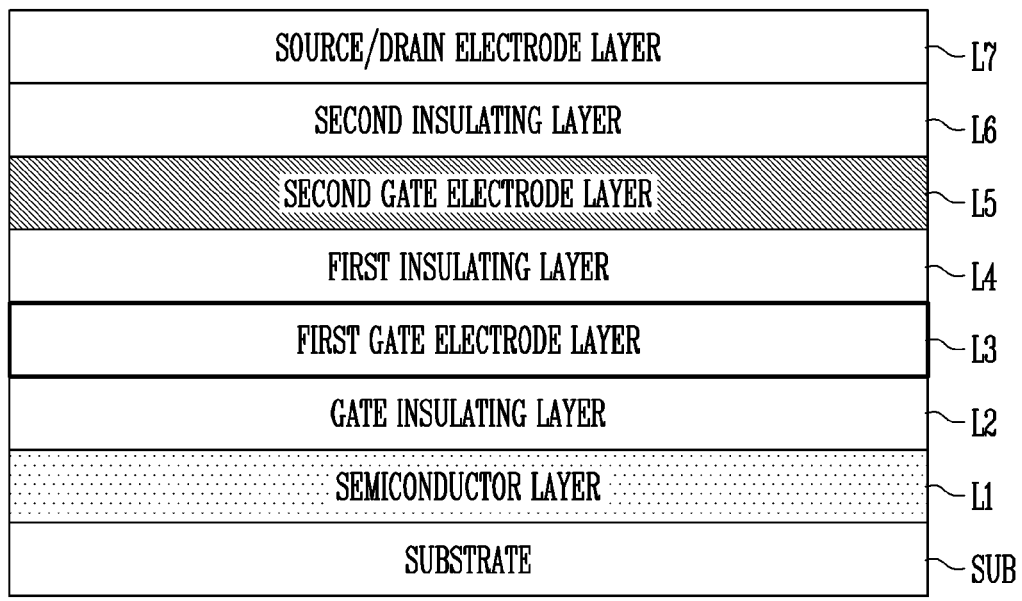
FIG. 17 is a diagram illustrating a stacked structure of a display device according to some exemplary embodiments.

FIG. 17 is a diagram illustrating a stacked structure of a display device according to some exemplary embodiments.

Referring to FIG. 17, the display device 9 or 9' of various exemplary embodiments may have a stacked structure including a substrate SUB, a semiconductor layer L1, a gate insulating layer L2, a first gate electrode layer L3, a first insulating layer L4, a second gate electrode layer L5, a second insulating layer L6, and a source/drain electrode layer L7.

The transistors, the capacitors, and other lines of the above described exemplary embodiments may be elements formed by patterning at least a part of the stacked structure.

The substrate SUB may be composed of various materials, such as glass, polymer, metal, and/or the like. The substrate SUB may be selected from one of a rigid substrate and a flexible substrate depending on the product to be applied. When the substrate SUB is configured to include a polymer organic substance, the substrate SUB may be formed of a material selected from the group consisting of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, cellulose acetate propionate, and the like. On the other hand, the substrate SUB may be composed of fiber glass reinforced plastic (FRP).

Although not shown, a buffer layer and/or a barrier layer may be disposed between the substrate SUB and the semiconductor layer L1. The buffer layer and/or the barrier layer may be employed to prevent the impurities of the substrate SUB from diffusing into the semiconductor layer L1, or to prevent moisture permeation. The buffer layer and/or the barrier layer may be composed of an organic insulating film, an inorganic insulating film, organic/inorganic insulating films, or the like, and may be composed of a single layer or a multilayer structure. For example, the buffer layer or the barrier layer may be composed of silicon nitride (SiNx), silicon oxide (SiOx), silicon oxynitride (SiOxNy), or the like.

The semiconductor layer L1 may be composed of polysilicon, amorphous silicon, an oxide semiconductor, an organic semiconductor, or the like. Some of the semiconductor layers L1 may constitute channels, others may be doped with N-type impurities, and still others may be doped with P-type impurities. For example, referring to FIG. 13, the P-type transistors T1, T3, T5, T7, and T9 of the stage circuit STi' may be doped with P-type impurities at portions contacting the source/drain electrodes. Also, the N-type transistors T2, T4, T6, T8, and T10 of the stage circuit STi' may be doped with N-type impurities at portions contacting the source/drain electrodes. Also, for example, referring to FIG. 15, the P-type transistors M1, M2, M3, M5, and M6 of the pixel PXij' may be doped with P-type impurities at portions contacting the source/drain electrodes. Also, the N-type transistors M4' and M7' of the pixel PXij' may be doped with N-type impurities at portions contacting the source/drain electrodes.

Each of the gate insulating layer L2, the first insulating layer L4, and the second insulating layer L6 prevent unwanted electrical contact of upper and lower conductive layers. The insulating layers L2, L4, and L6 may be formed of an organic insulating layer, an inorganic insulating layer, organic/inorganic insulating layers, or the like, and may be composed of a single layer or a multilayer structure. For example, the insulating layers L2, L4, and L6 may be composed of silicon nitride (SiNx), silicon oxide (SiOx), silicon oxynitride (SiOxNy), or the like.

Each of the first gate electrode layer L3, the second gate electrode layer L5, and the source/drain electrode layer L7 constitutes a conductive layer. Each of the conductive layers may be composed of a single layer or a multilayer structure, and may be composed of at least one of silver (Au), gold (Ag), aluminum (Al), molybdenum (Mo), chromium (Cr), titanium (Ti), nickel (Ni), neodymium (Nd), copper (Cu), platinum (Pt), and the like, or an alloy of at least one of the aforementioned materials.

The gate electrode of each transistor may be composed of the first gate electrode layer L3. The source/drain electrodes (e.g., one electrode/another electrode) of each transistor may be directly constituted by the impurity-doped portion of the semiconductor layer L1, or may further include portions of the source/drain electrode layer L7 in contact with the semiconductor layer L1. The channel of each transistor may be composed of the semiconductor layer L1.

Each capacitor may be configured by using the first gate electrode layer L3 as the lower electrode and the second gate electrode layer L5 as the upper electrode.

Figure 18:
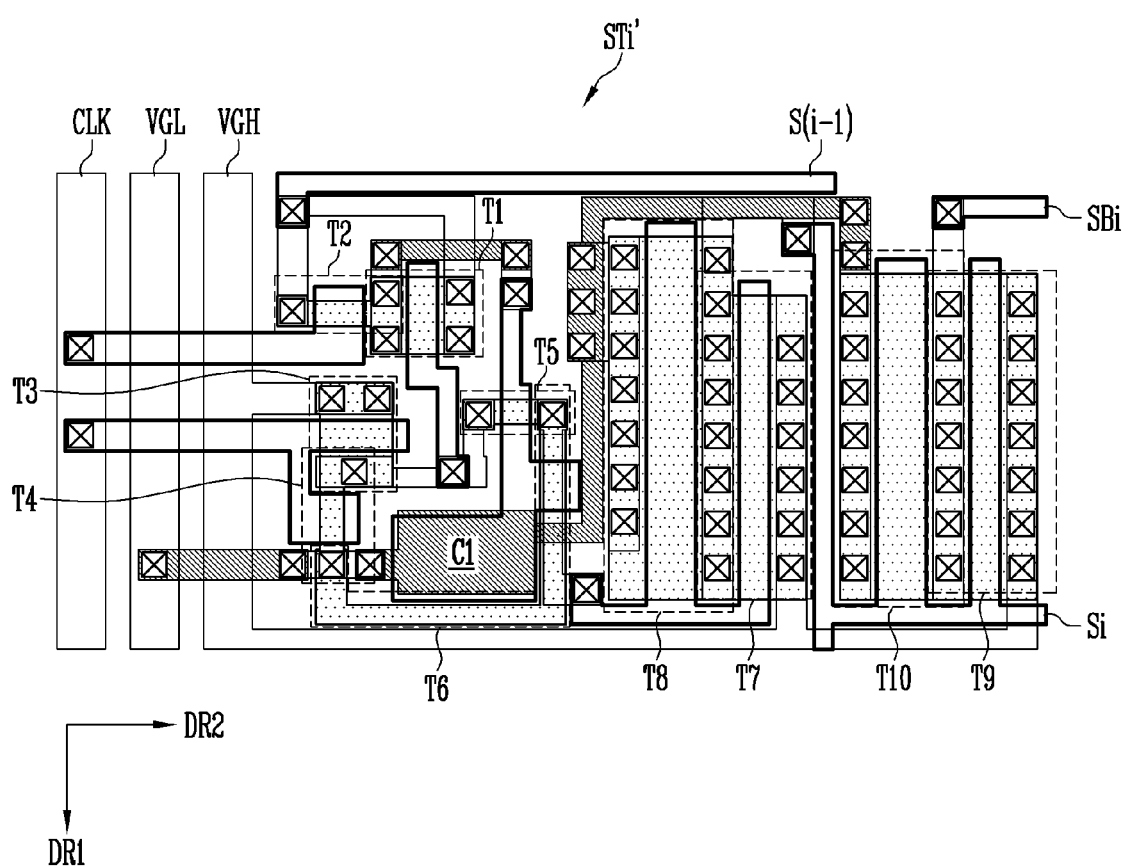
FIG. 18 is a diagram illustrating an exemplary layout of the stage circuit of FIG. 13 according to some exemplary embodiments.

FIG. 18 is a diagram illustrating an exemplary layout of the stage circuit of FIG. 13 according to some exemplary embodiments.

Each of the stage circuit STi', the clock signal line CLK, the first power voltage line VGH, and the second power voltage line VGL may include at least a part of the semiconductor layer L1, the first gate electrode layer L3, the second gate electrode layer L5, or the source/drain electrode layer L7.

Each of the transistors T1 to T10 may include at least a part of the semiconductor layer L1, at least a part of the first gate electrode layer L3, and at least a part of the source/drain electrode layer L7. One electrode and another electrode of each of the first to tenth transistors T1 to T10 may include at least a part of the source/drain electrode layer L7, the gate electrode of each of the first to tenth transistors T1 to T10 may include at least a part of the first gate electrode layer L3, and the channel of each of the first to tenth transistors T1 to T10 may include at least a part of the semiconductor layer L1.

The first capacitor C1 may include at least a part of the first gate electrode layer L3 and at least a part of the second gate electrode layer L5. The second node N2 may include at least a part of the second gate electrode layer L5. Also, the second power voltage line VGL may be connected to the stage circuit STi' by using the second gate electrode layer L5.

Referring to FIGS. 12, 13, and 18, the direction in which the stage circuits are arranged may be defined as a first direction DR1. As such, the clock signal line CLK, the first power voltage line VGH, and the second power voltage line VGL may extend in the first direction DR1 and may be branched and connected to the respective stage circuits.

Figure 19:
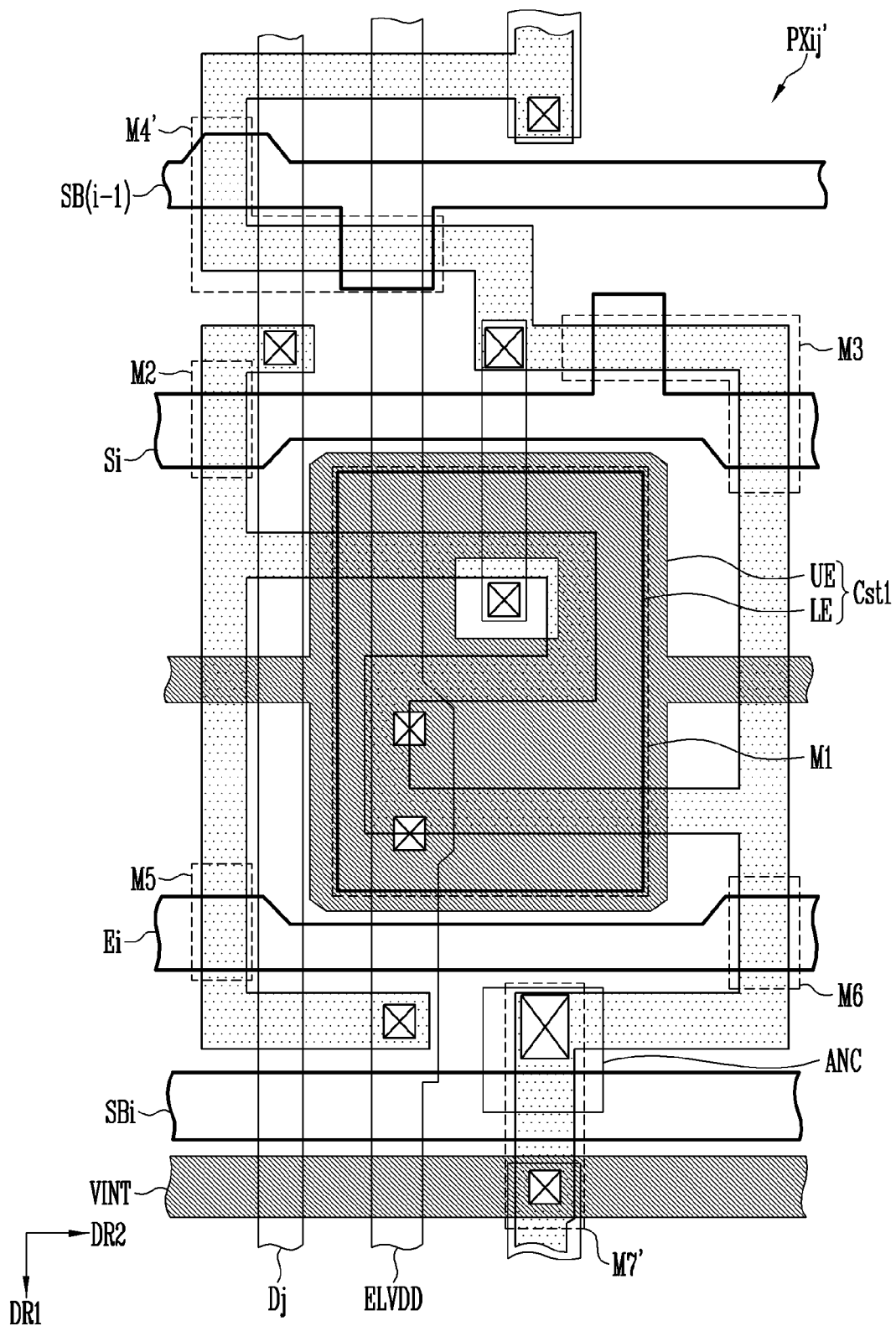
FIG. 19 is a diagram illustrating an exemplary layout of the pixel of FIG. 15 according to some exemplary embodiments.

The clock signal line CLK may extend in the first direction DR1 using the source/drain electrode layer L7, and may extend in the second direction DR2 using the contacted first gate electrode layer L3 as a bridge electrode such that the gate electrode of the second transistor T2 is formed. In FIGS. 18 and 19, a square filled by an X indicates that the overlapped electrodes are in contact with each other through a contact hole in an insulating layer.

Furthermore, the clock signal line CLK may extend in the second direction DR2 using another contacted portion of the first gate electrode layer L3 as a bridge electrode such that the gate electrodes of the third transistor T3 and the fourth transistor T4 are formed.

The second power voltage line VGL may extend in the first direction DR1 using the source/drain electrode layer L7, and may extend in the second direction DR2 using the contacted second gate electrode L5 as a bridge electrode such that another electrode of the first capacitor C1' is formed and the second power voltage line VGL provides a low voltage to the transistors T4, T6, T8, and T10. Furthermore, the second gate electrode layer L5 extending in the second direction DR2 may cross the sixth transistor T6 using the source/drain electrode layer L7 as a bridge electrode.

The first power voltage line VGH may extend in the first direction DR1 and the second direction DR2 using the source/drain electrode layer L7 so that the first power voltage line VGH may be connected to one electrode of each of the transistors T3, T7, and T9. In this layout, the first power voltage line VGH does not utilize a separate bridge electrode.

The first circuit unit CM1 may be disposed in the second direction DR2 from the first power voltage line VGH. Here, the first transistor T1 may be disposed in the second direction DR2 from the second transistor T2. The first transistor T1 and the second transistor T2 may physically share another electrode. In other circuit units described below, each transistor may physically share another electrode, thereby minimizing (or reducing) the utilized area.

The second circuit unit CM2 may be disposed in the first direction DR1 from the first circuit unit CM1. Here, the fourth transistor T4 may be disposed in the first direction DR1 from the third transistor T3.

The first capacitor C1 may be disposed in the second direction DR2 from the second circuit unit CM2. In addition, the third circuit unit CM3 may be connected to the second circuit unit CM2 such that the third circuit unit CM3 and the second circuit unit CM2 surround the first capacitor C1 in a plan view, e.g., when viewed in a direction perpendicular to the first and second directions DR1 and DR2. Here, the sixth transistor T6 may be disposed in the first direction DR1 from the fifth transistor T5.

The fourth circuit unit CM4 may be disposed in the second direction DR2 from the third circuit unit CM3. Here, the seventh transistor T7 may be disposed in the second direction DR2 from the eighth transistor T8.

The fifth circuit unit CM5 may be disposed in the second direction DR2 from the fourth circuit unit CM4. Here, the ninth transistor T9 may be disposed in the second direction DR2 from the tenth transistor T10.

Each of the previous scan line S(i−1), the current scan line Si, and the current inversion scan line SBi may include at least a part of the first gate electrode layer L3.

FIG. 19 is a diagram illustrating an exemplary layout of the pixel of FIG. 15 according to some exemplary embodiments.

Each of the current scan line Si, the current inversion scan line SBi, the previous inversion scan line SB(i−1), the emission line Ei, and the lower electrode LE of the storage capacitor Cst1 may include at least a part of the first gate electrode layer L3.

Each of the upper electrode UE of the storage capacitor Cst1 and the initialization voltage line VINT may include at least a part of the second gate electrode layer L5.

Each of the data line Dj, the first driving voltage line ELVDD, and some of the bridge electrodes may include at least a part of the source/drain electrode layer L7.

The channel of each of the transistors M1, M2, M3, M4', M5, M6, and M7' may include at least a part of the semiconductor layer L1. The gate electrode of each of the transistors M1, M2, M3, M4', M5, M6, and M7' may include at least a part of the first gate electrode layer L3. One electrode and another electrode of each of the transistors M1, M2, M3, M4', M5, M6, and M7' may include at least a part of the semiconductor layer L1 or may be composed of a combination of the semiconductor layer L1 and the source/drain electrode layer L7.

A connection electrode ANC may connect one electrode of the transistor M7' and another electrode of the transistor M6 to the anode of the organic light emitting diode OLED1.

The scan driver according to various exemplary embodiments may have improved driving characteristics and may consume less area as compared with a conventional scan driver.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A scan driver comprising:
stage circuits, each of the stage circuits comprising:
a first circuit comprising a control terminal connected to a first node, the first circuit being configured to selectively connect and disconnect a previous scan line of a previous stage circuit to a second node in accordance with a control signal at the control terminal;
a second circuit comprising a control terminal connected to a clock signal line, the second circuit being configured to selectively connect one of a first power voltage line and a second power voltage line to the first node in accordance with a control signal at the control terminal;
a third circuit comprising a control terminal connected to the second node, the third circuit being configured to selectively connect one of the first node and the second power voltage line to a third node in accordance with a control signal at the control terminal;
a fourth circuit comprising a control terminal connected to the third node, the fourth circuit being configured to selectively connect one of the first power voltage line and the second power voltage line to a current scan line in accordance with a control signal at the control terminal; and
a first capacitor connecting the control terminal of the third circuit and the second power voltage line.

2. The scan driver of claim 1, wherein the first circuit further comprises:
a first transistor comprising one electrode connected to the previous scan line, another electrode connected to the second node, and a gate electrode connected to the first node; and
a second transistor comprising one electrode connected to the previous scan line, another electrode connected to the second node, and a gate electrode connected to the clock signal line.

3. The scan driver of claim 2, wherein the second circuit further comprises:
a third transistor comprising one electrode connected to the first power voltage line, another electrode connected to the first node, and a gate electrode connected to the clock signal line; and
a fourth transistor comprising one electrode connected to the second power voltage line, another electrode connected to the first node, and a gate electrode connected to the clock signal line.

4. The scan driver of claim 3, wherein the third circuit further comprises:
a fifth transistor comprising one electrode connected to the first node, another electrode connected to the third node, and a gate electrode connected to the second node; and
a sixth transistor comprising one electrode connected to the second power voltage line, another electrode connected to the third node, and a gate electrode connected to the second node.

5. The scan driver of claim 4, wherein the fourth circuit further comprises:
a seventh transistor comprising one electrode connected to the first power voltage line, another electrode connected to the current scan line, and a gate electrode connected to the third node; and
an eighth transistor comprising one electrode connected to the second power voltage line, another electrode connected the current scan line, and a gate electrode connected to the third node.

6. The scan driver of claim 5, wherein each of the stage circuits further comprises:
a fifth circuit comprising a control terminal connected to the current scan line, the fifth circuit being configured to selectively connect one of the first power voltage line and the second power voltage line to a current inversion scan line in accordance with a control signal at the control terminal.

7. The scan driver of claim 6, wherein the fifth circuit further comprises:
   a ninth transistor comprising one electrode connected to the first power voltage line, another electrode connected to the current inversion scan line, and a gate electrode connected to the current scan line; and
   a tenth transistor comprising one electrode connected to the second power voltage line, another electrode connected to the current inversion scan line, and a gate electrode connected to the current scan line.

8. The scan driver of claim 7, wherein:
   the stage circuits are arranged in a first direction;
   the clock signal line, the first power voltage line, and the second power voltage line extend in the first direction and are branched and connected to each of the stage circuits; and
   the first circuit is disposed in a second direction from the first power voltage line, the second direction crossing the first direction.

9. The scan driver of claim 8, wherein the second circuit is disposed in the first direction from the first circuit.

10. The scan driver of claim 9, wherein the first capacitor is disposed in the second direction from the second circuit.

11. The scan driver of claim 10, wherein the third circuit is connected to the second circuit such that the third circuit and the second circuit surround the first capacitor in a plan view.

12. The scan driver of claim 11, wherein the fourth circuit is disposed in the second direction from the third circuit.

13. The scan driver of claim 12, wherein the fifth circuit is disposed in the second direction from the fourth circuit.

14. The scan driver of claim 13, wherein the first transistor is disposed in the second direction from the second transistor.

15. The scan driver of claim 14, wherein the fourth transistor is disposed in the first direction from the third transistor.

16. The scan driver of claim 15, wherein the sixth transistor is disposed in the first direction from the fifth transistor.

17. The scan driver of claim 16, wherein the seventh transistor is disposed in the second direction from the eighth transistor.

18. The scan driver of claim 17, wherein the ninth transistor is disposed in the second direction from the tenth transistor.

19. The scan driver of claim 7, wherein each of the stage circuits, the clock signal line, the first power voltage line, and the second power voltage line comprises at least a part of at least one of a semiconductor layer, a first gate electrode layer, a second gate electrode layer, and a source/drain electrode layer.

20. The scan driver of claim 19, wherein each of the clock signal line, the first power voltage line, and the second power voltage line comprises at least a part of the source/drain electrode layer.

21. The scan driver of claim 20, wherein:
   one electrode and another electrode of each of the first to tenth transistors comprises at least a part of the source/drain electrode layer;
   a gate electrode of each of the first to tenth transistors comprises at least a part of the first gate electrode layer; and
   a channel of each of the first to tenth transistors comprises at least a part of the semiconductor layer.

22. The scan driver of claim 21, wherein the first capacitor comprises at least a part of the first gate electrode layer and at least a part of the second gate electrode layer.

23. The scan driver of claim 22, wherein the second node comprises at least a part of the second gate electrode layer.

24. The scan driver of claim 23, wherein the second power voltage line is connected to each of the stage circuits using the second gate electrode layer.

* * * * *